United States Patent [19]

Scheel

[11] Patent Number: 5,471,943
[45] Date of Patent: Dec. 5, 1995

[54] PROCESS AND DEVICE FOR PULLING CRYSTALS ACCORDING TO THE CZOCHRALSKI METHOD

[76] Inventor: Hans L. Scheel, 36, Chemin de la Clergere, CH-1009 Pully VD, Switzerland

[21] Appl. No.: 671,737
[22] PCT Filed: Oct. 12, 1988
[86] PCT No.: PCT/EP88/00912
§ 371 Date: Jun. 12, 1991
§ 102(e) Date: Jun. 12, 1991
[87] PCT Pub. No.: WO/90/4054
PCT Pub. Date: Apr. 19, 1990

[30] Foreign Application Priority Data

Oct. 12, 1988 [WO] WIPO .................. PCT/EP88/00912

[51] Int. Cl.⁶ ........................................... C30B 15/12
[52] U.S. Cl. .......................... 117/20; 117/28; 117/31; 117/213; 117/218; 117/932
[58] Field of Search ........................ 117/13, 20, 28, 117/31, 213, 218, 932

[56] References Cited

U.S. PATENT DOCUMENTS

| | | | |
|---|---|---|---|
| 3,637,439 | 1/1972 | DeBie | 117/31 |
| 4,246,064 | 1/1981 | Dewees et al. | 117/31 |
| 4,874,458 | 10/1989 | Nishizawa | 117/17 |
| 4,936,949 | 6/1990 | Kida et al. | 117/31 |
| 5,290,395 | 3/1994 | Matsumoto et al. | 117/17 |
| 5,306,474 | 4/1994 | Kida et al. | 117/17 |

FOREIGN PATENT DOCUMENTS 58-204895 11/1983 Japan .................. 117/31

*Primary Examiner*—Robert Kunemund
*Attorney, Agent, or Firm*—Dennison, Meserole, Pollack & Scheiner

[57] ABSTRACT

A process and apparatus for growing a crysrtal by the Czochralski method, in which a melt is disposed in a crucible, partitioned into an outer annular portion and an inner cylindrical portion by an annular separation element which is open at its bottom, the open bottom being spaced from the bottom of the crucible. The separation element is rotated on its vertical axis and a crystal is pulled from the melt in the inner cylindrical portion by raising a crystal holder, which is also rotated, in the vertical direction. The melt required for growing the crystal flows from the outer annular portion to the inner cylindrical portion over the entire cross-section of the inner cylindrical portion at the bottom of the annular separation element.

17 Claims, 1 Drawing Sheet

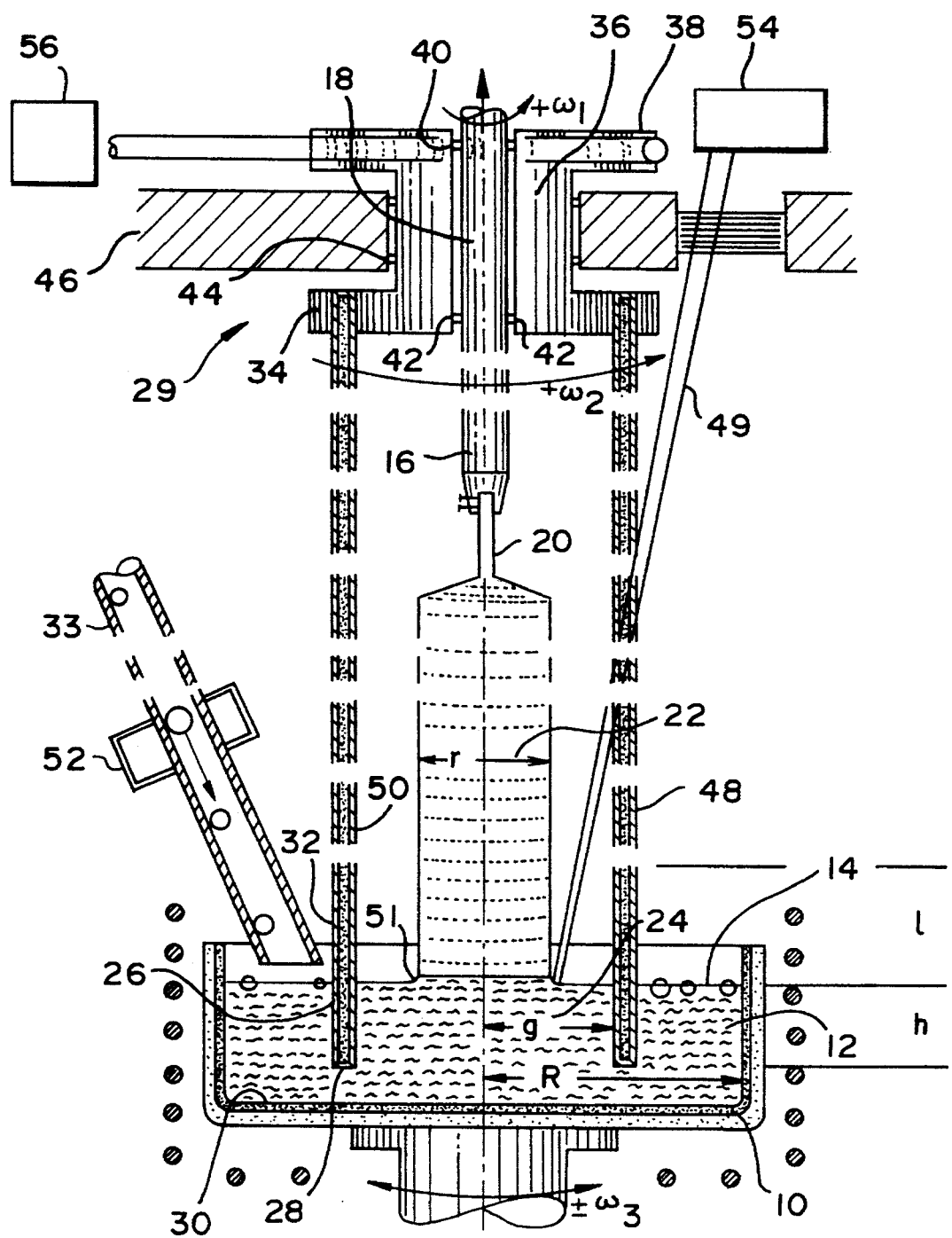

PROCESS AND DEVICE FOR PULLING CRYSTALS ACCORDING TO THE CZOCHRALSKI METHOD

BACKGROUND OF THE INVENTION

The invention refers to a process for growing crystals by the Czochralski method using a melt within a crucible, a holden for the crystal to be pulled from the melt, and coaxial to the rotating and pulled crystal holder a separation wall in the form of a hollow cylinder dipping from the melt surface into the melt, and to an equipment for performing the process.

Crystals are grown by the Czochralski method whereby the free-hanging crystal is pulled out of a melt contained in a crucible. Thereby the temperature conditions are precisely monitored. The greatest impact of the Czochralski method is in growth of high-purity crystals for semiconductor technology.

The two-chamber technique allows to reduce segregation effects, to approach a constant composition of melt and thus of the crystals, by supplying fresh melt from a reservoir to that region of the melt from which the crystal is pulled. This is achieved by a hollow cylinder coaxial to the crystal and extending from the melt surface to the crucible bottom to which it is fixed. The supply of melt is achieved through perforations in the separation wall. Such a two-chamber system, or an internal crucible serving a similar purpose, may possibly reduce the axial segregation problem, however, without sufficient reduction of the local segregation problem, the striations problem.

Other processes have become known for the reduction of striations, for instance the reduction of convection by a strong magnetic field. However, these measures require large efforts and, among others, have the disavantages of detrimental effects on electrical properties of the crystals, and of "overheating" of the melt. Furthermore, in case of gallium arsenide the distribution of dislocations is more inhomogeneus than in crystals fabricated without magnetic field.

SUMMARY OF THE INVENTION

The purpose of the present invention is to establish a process and an equipment which does not only reduce the axial segregation problem, but which additionally reduces the local and radial segregation problem. Furthermore, improvements of the structural perfection of the pulled crystals as well as an improved solid-liquid interface are to be achieved.

According to this invention these tasks are achieved by a separation wall which is not extending to the crucible bottom and which is rotated in the same direction with the crystal holder. The rotation rates of crystal holder and separation wall may differ, but the rotation rates may also be identical.

In addition, the crucible can be rotated in a known manner whereby its sense of rotation may be equal or contrary to that of crystal holder and separation wall. In a further elaboration it is forseen to achieve a constant melt level by adding material to the region between separation wall and crucible wall whereby the quantity of feed material corresponds to the material pulled as crystal from the melt.

The effect of this invention can be understood by an annular space within the rotating separation wall (beneath the crystal) which is filled with melt, and which is quasi "separated" from the remainder fraction of the melt. In this internal melt volume the natural and the forced convection will be reduced, and this effect is enforced with increasing rotation rate of crystal and separation wall. Especially the formation of Taylor-Proudman cells will be suppressed in this region, and the disturbing effect of Marangoni convection is significantly reduced.

The axial segregation problem in present state-of-the-art is significantly reduced in this invention by a comparably fast approach of a steady-state concentration in the crystal. This concentration remains constant during a certain growth period, until towards the end of the process (at a distribution coefficient less than one) it is increasing. The quality and thus the yield of the pulled crystal is thus increased. This advantage is even more significant in a continous process in which continuously the material quantity pulled as crystal from the melt is replenished, and where a steady state may be established where the dopant concentration in the crystal corresponds to that of the starting material. Only in the final phase the impurity concentration is enriched due its increased concentration in the melt. As a consequence the yield of crystal of quasi constant dopant concentration can be significantly increased by using relatively simple measures. This makes the large efforts in state-of-the-art as for example strong magnetic fields with their disadvantages unnecessary.

The melt fraction within the rotating separation wall (and from which the crystal is pulled) is separated from the main fraction of the melt by an shear flow layer. This allows to suppress the convective transport of parts of the melt of different temperatures towards the growing crystal interface, thereby reducing significantly the fluctuations of its growth rates. This suppresses local axial and radial inhomogencities.

Consequently the crystals fabricated by the process based on the present invention, are qualified for electronic and optoelectronic devices with properties within narrow tolerances, and for highly integrated circuits.

On the melt surface, within the co-rotating separation ring, the vibrations and surface waves as well as thermal asymetries around the growing crystal, which otherwise also cause striations problems, are minimised. Also melt-level fluctuations caused by the piece-by-piece material supply in the continuous process are damped by the separation wall and the rotating central fraction of the melt.

In growth of silicon crystals by the process of this invention, the well-known SiO problem can be reduced. The melt corrodes and dissolves the crucible material $SiO_2$, the oxygen is partially incorporated in the crystals and partially evaporates as SiO. The oxygen concentration in the Si crystals should be kept within narrow tolerances, depending on the application, for example at 16+1 ppm.

The ratio of melt volumes (volumes of the "ring" and of the rest of the melt) and growth rate determines the delay time of the silicon in the crucible, whereas the geometrical factors and the difference of rotation rates between crystal (=ring) and crucible determine, by action of Taylor and shear flows, the dissolution rate of the $SiO_2$ crucible. By optimization of these factors and parameters, a specific oxygen concentration in the silicon crystal and its extended axial homogeneity can be obtained. Short delay times-in contrast to conventional technology-have allowed to obtain relatively small oxygen concentrations in Czochralski-grown silicon crystals.

The process according to this invention is to be applied in growth of crystals by the Czochralski method, for instance of Si, GaAs, Ge, InP, bismuth germanate, garnets, titanium-doped sapphire, or ruby, specifically when homogeneity and yield of homogeneus crystals are of importance.

The equipment for growth of crystals by the Czochralski method with a crucible containing the melt, a crystal holder (for the crystal to be pulled from the melt) which can be rotated and raised according to the growth rate, and a separation wall coaxial to the crystal holder and penetrating through the melt surface, is distinguished by the fact that the separation walls ends at a distance above the crucible bottom, and that is connected with a drive for obtaining co-rotation with the crystal holder. Preferably the melt volume within the separation ring is kept constant, for instance by lowering the ring to follow the melt level, or by replenishing the material grown as crystal by feeding starting material between separation wall and crucible wall. This feeding material is constantly monitored, for instance optically or by weight control, in order to match the material pulled as crystal. This automatically facilitates the control of the crystal diameter, so that this may in many cases save complex diameter controls. Of course, in this case the temperature of the melt must be controlled with appropriate precision.

Preferably the ring volume is open on the lower side in order to allow simple insertion and removal of the ring from the melt. Obviously the ring volume can be partially closed on its bottom side by means of a perforated cover.

The separation wall itself can be held and driven from above or from below the crucible, or also from the sides. Preferably, the separation ring is fixed by rods to a disc above the melt surface. This disc is held by a tube which is connected with the drive. The axis of the crystal holder passes through this tube. The construction material for the separation wall frequently will be the same as the crucible material. Specifically, in silicon fabrication the separating ring may consist of quartz glass internally reinforced by bodies from graphite, silicon nitride or metal. In the case of gallium arsenide the ring may be formed from boron nitride, aluminium nitride or aluminium oxide. For Czochralski growth of oxides and oxide compounds platinum, iridium, rhodium, gold and their alloys may be utilized. In most cases the material for crucibles will also be used for the separation wall.

The height h of the ring volume may be chosen as 7 cm when the radll of crystal, internal ring and internal crucible are 5.5 cm, 9 cm and 16.5 cm, respectively.

The rotation rate $\omega_3$ of the crucible may be chosen in the range 0–5 rpm, whereas the rotation rates $\omega_1$ and $\omega_2$ of separation wall and crystal will be in the range 8 to 32 rpm, in any case should be in the range 2 to 105 rpm (rpm= rotations per minute).

BRIEF DESCRIPTION OF THE DRAWING

Further details of the invention follow from the claims and derived features, either separately and/or in combination.

In the following the invention will be described in more detail by means of a drawing of an example, shown in vertical cross-section further details may cause advantages and specific features.

DESCRIPTION OF THE PREFERRED EMBODIMENTS

In the single figure a purely schematic presentation of the invented equipment for growth of crystals by the Czochralski method is given. This arrangement is contained in a water-cooled steel vessel (not shown) and consists of a crucible (10) containing the melt (12). Above the surface of the melt (14) is positionned a seed crystal holder (16) which can be rotated about its axis (18) and translated vertically according to the growth velocity. A seed crystal (20) of desired orientation is fixed to the crystal holder (16) and then pulled as crystal (22) from the melt (12). According to the invention, a ring volume (24) is introduced, coaxially to the crystal holder (16), into the melt (12) from which the crystal (22) grows. Furthermore, this ring volume (24) can be rotated in the same sense with the crystal holder (16). For this the ring volume is surrounded by a separation wall (26) in the form of a hollow cylinder fixed to a holder (29). The separation wall (26) does with its lower end (28) not extend to the crucible bottom (30). Moreover, the upper end (32) projects out of the melt (12) respectively (24), thus protrudes the surface (14) of the melt. Material is continously fed into the region between the separation wall (26) and the crucible wall (10) by means of a supply pipe (33). Thereby the amount of added material corresponds to the material removed from the melt (24) in form of the growing crystal (22). This allows to keep a constant melt level (14) so that the height h of the separation wall (26) dipping into the melt (12) respectively (24) remains constant. The material added by means of the supply tube (33) into the crucible can be monitored or counted by means of an optical system (52) in order to achieve a constant compensation of the material.

As mentioned before, the separation wall (26) is fixed to the holder (29) which in the practical example consists of a disc element (34), a hollow tube (36), and a driving pully (38), which is connected with a drive (56). The holder (16) is conducted through the hollow tube (36) and held by precision bearings (40) and (42), for instance magnet or air bearings, so that the holder (16) can be rotated and lifted or lowered relative to the hollow tube (36). The latter itself is also fixed to precision bearings (44), fixed by means of (46) to the steel chamber (not shown), and can be rotated and moved along the vertical axis. The fixation of the separation wall (26) to the disc element (34) is achieved by single rods indicated in the drawing by (48) and (50). As a consequence the space between the separation wall (26) and the disc element (34) is essentially accessible. Thus the melt meniscus (51) at the crystal (22) can be optically monitored (49), for instance by a Laser reflection system (54). By means of the length l of the separation cylinder (32) protruding out of the melt, the temperature conditions in the upper melt region and in the lower crystal region can be adjusted. This allows to optimize the shape of the crystal-melt interface for an economic crystal pull rate in order to improve the structural perfection of the crystal (for instance GaAs). The relative rotation rate of crystal holder (16) and separation wall (26) can be adjusted, but rotation should be in the same sense.

Rotation in opposite sense (counterrotation) of crystal and separation wall does not suppress convection in the melt region below the crystal, in the contrary. This may be utilized to suppress the striations, and thus has certain advantages. However, this does not help to reduce the axial segregation problem.

By means of this invention the desired crystals can be grown by the Czochralski method whereby the segregation problems caused in state-of-the-art processes can be reduced.

Furthermore, the loss of structure can be reduced. Crystals pulled by state-of-the-art lose their crystalline perfection when they reach a critical length: in formerly dislocation-free silicon crystals dislocations are then formed, or in gallium arsenide twins. These defects lead to the loss of structural perfection when the growth process is continued. This loss of structure occurs in the process of this invention in a later phase of growth, thus increasing the crystal yield.

A further advantage is the fact that crucible rotation is not necessary. The liquid fraction within the ring should not be intensively mixed, whereas the outer melt fraction should be homogeneized. This can be achieved in the system of stationary crucible and rotating separation wall/crystal, whereas in conventional Czochralski technology normally crucible rotation is applied. The stationary crucible is specially advantageous in high-pressure Czochralski processes and in the hot wall technology (e.g. for GaAs), as the equipment can be kept relatively simple. Futhermore the crucible shape can deviate from the round shape which may simplify the material supply in a continuous process.

The invention was so far described for a continuous crystal pulling process with feed supply. However, it is equally valuable for the classical batch process, where the crystal is pulled from the melt without replenishing. In this case a relative vertical motion between separation wall and crucible is required to keep the separation wall dipped in the melt, to a minimal distance of 0.5 mm between crucible bottom and separation wall towards the end of the growth run.

The procedure of the invention is as follows:

For pulling of a silicon crystal of 11 cm diameter a quartz glass crucible (within a graphite container) of 33 cm internal diameter and 14 cm height is filled with 20 kg polycrystalline silicon. After sealing the steel chamber, creating a vacuum and argon filling at a rate of about 800 l per hour, a steady-state pressure of about 10 Torr is adjusted. After melting the silicon, the crucible is lifted to the optimum position so that the separation wall dips into the melt to the desired level. A certain overheating of the melt is thereby required in order to prevent solidification of the melt. After reaching the optimum melt temperature and a thermal steady-state, the seed crystal mounted to the crystal holder is dipped into the melt and then pulled and enlarged to the desired diameter by conventional process steps. The material supply is started then and adjusted to the experienced value which allows to keep a constant melt level for a crystal pullarte of 11 cm per hour. Thereby the crucible is not turned, whereas crystal and separation wall are rotated in the same sense at a rate of 26 rpm. The melt temperature is kept constant so that in the beginning the heating power must be constantly adjusted until thermal steady state is reached. After reaching a crystal length of 1.4 m, the process is stopped by steps wellknown to the operateur, and the scparation wall is removed from the residual melt.

I claim:

1. A process for growing a crystal by the Czochralski method, comprising the steps of:
   a) disposing the melt in a crucible open at its top and having a floor at its bottom;
   b) partitioning the crucible into an outer annular portion and an inner cylindrical portion with an annular separation element open across its entire cross-section at its bottom, said open bottom being spaced from the bottom of the crucible;
   c) rotating the separation element on its vertical axis at a speed $\omega_1$;
   d) pulling a crystal from the melt in the inner cylindrical portion by raising a crystal holder in a vertical direction; and
   e) rotating the crystal holder on its vertical axis at a speed $\omega_2$ during the pulling:

wherein the melt required for growing the crystal flows over the entire open cross-section of the inner cylindrical portion at the bottom of the annular separation element.

2. Process according to claim 1, wherein $\omega_1$, $\omega_2$, or both $\omega_1$ and $\omega_2$ are varied during the growing.

3. Process according to claim 1, wherein $\omega_1$ is 2 to 105 rpm.

4. Process according to claim 1, wherein $\omega_2$ is 2 to 105 rpm.

5. Process according to claim 1, additionally comprising supplying melt to the crucible in the outer annular portion to replace melt removed as the crystal.

6. Process according to claim 5, wherein the melt is maintained at a constant level within the outer annular portion.

7. Process according to claim 5, wherein said supplying is optically monitored.

8. Process according to claim 1, wherein the crystal holder and separation element are rotated in the same direction.

9. Process according to claim 8, additionally comprising rotating said crucible, in a direction which is the same as or opposite to the rotation of the crystal holder and separation element.

10. Process according to claim 1, wherein the crystal has a radius r of 1 cm$\leq$r$\leq$12 cm, the melt within the inner cylindrical portion has a height h of 0.1 cm$\leq$h$\leq$10 cm, the inner cylindrical portion has a radius $\rho$ of 1.5 cm$\leq\rho\leq$18 cm, and the crucible has a radius R of 2 cm$\leq$R$\leq$32 cm.

11. Process according to claim 1, wherein the space between the bottom of the separation element and the melt surface is not changed during the pulling of the crystal.

12. Apparatus for growing crystal by the Czochralski method, comprising:
   a) a crucible having an outer wall, a bottom floor and an open top, for containing a melt;
   b) a crystal holder positioned for pulling a crystal upwardly from the melt in the crucible;
   c) means for moving said crystal holder vertically;
   d) means for rotating said crystal holder on its vertical axis;
   e) an annular separation element formed of a peripheral wall and being open across its entire cross-section at its bottom, said separation element being positioned in said crucible coaxial with the crystal holder, with the bottom spaced from the bottom floor of the crucible; and
   f) means for rotating the annular separation element on its vertical axis in the same direction as the crystal holder.

13. Apparatus according to claim 12, wherein said separation element is supported by at least two rod elements attached to said separation element at an upper portion thereof and extending upwardly to a disk element disposed above the crucible and having a central passage therethrough, through which said crystal holder passes.

14. Apparatus according to claim 13, additionally comprising a sheath element disposed above said disk element, and including said means for rotating said crystal holder.

15. Apparatus according to claim 12, wherein the separation element has an inner radius $\rho$ of 1.5 cm$\leq\rho\leq$18 cm and the crucible has a radius R of 2 cm$\leq$R$\leq$32 cm.

16. Apparatus according to claim 12, additionally comprising means for adding melt to the crucible between the outer wall and the separation element.

17. Apparatus according to claim 12, additionally comprising means for rotating the crucible.

\* \* \* \* \*